(12) United States Patent
Jo

(10) Patent No.: US 7,816,259 B2
(45) Date of Patent: Oct. 19, 2010

(54) METHOD OF FORMING A CONTACT IN A SEMICONDUCTOR DEVICE

(75) Inventor: Bo-Yeoun Jo, Gimpo (KR)

(73) Assignee: Dongbu Electronics Co., Ltd., Seoul (KR)

( * ) Notice: Subject to any disclaimer, the term of this patent is extended or adjusted under 35 U.S.C. 154(b) by 173 days.

(21) Appl. No.: 11/257,980

(22) Filed: Oct. 24, 2005

(65) Prior Publication Data

US 2006/0094227 A1    May 4, 2006

(30) Foreign Application Priority Data

Oct. 25, 2004    (KR)    .................. 10-2004-0085256

(51) Int. Cl.
*H01L 21/44* (2006.01)
(52) U.S. Cl. ................ 438/654; 257/E21.585
(58) Field of Classification Search ................ 438/706, 438/715, 716, 720, 672, 652, 653, 654, 643, 438/644; 257/E23.145, E21.584, E21.858
See application file for complete search history.

(56) References Cited

U.S. PATENT DOCUMENTS

| | | | |
|---|---|---|---|
| 4,944,836 A | 7/1990 | Beyer et al. | |
| 5,008,216 A | 4/1991 | Huang et al. | |
| 5,008,730 A | 4/1991 | Huang et al. | |
| 5,221,853 A | 6/1993 | Joshi et al. | |
| 5,401,675 A | 3/1995 | Lee et al. | |
| 5,403,779 A | 4/1995 | Joshi et al. | |
| 5,889,328 A | 3/1999 | Joshi et al. | |
| 6,066,577 A | 5/2000 | Cooney, III et al. | |
| 6,284,657 B1 * | 9/2001 | Chooi et al. | 438/687 |
| 6,309,977 B1 * | 10/2001 | Ting et al. | 438/706 |
| 6,310,300 B1 | 10/2001 | Cooney, III et al. | |
| 6,511,575 B1 * | 1/2003 | Shindo et al. | 355/30 |
| 6,616,767 B2 * | 9/2003 | Zhao et al. | 219/121.52 |
| 2002/0175420 A1 * | 11/2002 | Dorleans | 257/774 |
| 2003/0137050 A1 * | 7/2003 | Chambers et al. | 257/750 |
| 2003/0194859 A1 * | 10/2003 | Huang | 438/652 |
| 2004/0005783 A1 * | 1/2004 | Lee | 438/706 |
| 2005/0046028 A1 * | 3/2005 | Jung | 257/751 |
| 2005/0054196 A1 * | 3/2005 | Wu et al. | 438/680 |
| 2005/0087753 A1 * | 4/2005 | D'Evelyn et al. | 257/98 |

* cited by examiner

*Primary Examiner*—David Vu
(74) *Attorney, Agent, or Firm*—The Law Offices of Andrew D. Fortney; Andrew D. Fortney; Anthony R. Jimenez

(57) ABSTRACT

Deterioration of yield may be prevented when a contact in a semiconductor device is made by a method including forming a contact hole by selectively removing an insulating layer from a semiconductor substrate, depositing a barrier layer on the insulating layer and on the surface of (or in) the contact hole, depositing an initial tungsten layer on the barrier layer to at least a predetermined thickness, removing particles generated during at least one of the depositing steps, and filling the contact hole with an additional tungsten layer.

19 Claims, 6 Drawing Sheets

FIG.4

| Process condition / Step | Chamber pressure | Source power (W) | Bias power (W) | Process gas | Flow rate (sccm) | Time (sec) |
|---|---|---|---|---|---|---|
| S310 (Etching the first tungsten layer) | 10mTorr | 1200 | 0 | SF$_6$ | 70 | 7 |
| | | | | N$_2$ | 70 | |
| S320 (Removing particles) | 10mTorr | 1200 | 0 | Cl$_2$ | 70 | 30 |
| | | | | Ar | 70 | |
| S330 (First out-gassing) | 10mTorr | 1200 | 300 | Ar | 70 | 15 |
| S330 (Second out-gassing) | 10mTorr | 1200 | 300 | N$_2$ | 70 | 15 |
| S340 (Pumping) | 0mTorr | 0 | 0 | — | — | 15 |

METHOD OF FORMING A CONTACT IN A SEMICONDUCTOR DEVICE

CROSS-REFERENCE TO RELATED APPLICATION

This application claims priority to and the benefit of Korean Patent Application No. 10-2004-0085256, filed in the Korean Intellectual Property Office on Oct. 25, 2004, the entire contents of which are incorporated herein by reference.

BACKGROUND OF THE INVENTION (a) Field of the Invention

The present invention relates to a method of manufacturing a semiconductor device. More particularly, the present invention relates to a method of forming a contact in a semiconductor device that can reduce or prevent deterioration of yield due to fallout particles.

(b) Description of the Related Art

Recently, as semiconductor integrated circuits have become more highly integrated, various methods for effective connection between wiring in a limited area have been proposed. Among them, a method enabling formation of multi-layered conductive lines in the integrated circuit has been widely used. According to such a multi-layer wiring method, a semiconductor chip may be manufactured at a very small size, since a space for wiring between devices may not be required.

A conventional method of forming a contact will hereinafter be described while referring to FIG. 1.

First, an interlayer insulating layer 102 composed of tetraethyl orthosilicate (TEOS), borophosphosilicate glass (BPSG), etc., is deposited on a semiconductor substrate 101 having a metal line layer thereon. After an etching mask (not shown) is formed on the interlayer insulating layer 102, a contact hole (not shown) is formed by selectively etching the interlayer insulating layer 102 using the mask.

Then, a barrier layer 104 is formed by the deposition of a titanium (Ti) film or a titanium (Ti)/titanium nitride (TiN) bilayer film by a sputtering method. Subsequently, a tungsten layer 106 is deposited by a chemical vapor deposition (CVD) method, and then is planarized by a chemical mechanical polishing (CMP) method, so the contact 108 that connects between metal lines in adjacent layers or between a metal line and an electrode is completed.

In such a method of forming a contact in a semiconductor device, fallout particles 110 are usually generated during the deposition of the barrier layer 104. Typically, such particles 110 are removed by a physical method, for example, by using a scrubber.

However, it is known that, according to such a conventional method using a scrubber, the particles are not always effectively removed. Therefore, the yield of semiconductor devices may not be achieved to a sufficiently high or desired level.

The above information disclosed in this Background section is only for enhancement of understanding of the background of the invention and therefore it may contain information that does not form the prior art that is already known in this country or any other country to a person of ordinary skill in the art.

SUMMARY OF THE INVENTION

The present invention has been made in an effort to provide a method for forming a contact in a semiconductor device having an advantage of an improved yield by effectively removing fallout particles.

An exemplary method for forming a contact according to an embodiment of the present invention includes forming a contact hole by selectively removing (portions of) an insulating layer on a semiconductor substrate, depositing a barrier layer on the insulating layer and on the surface of (e.g., in) the contact hole, depositing an initial tungsten layer on the barrier layer to at least a predetermined thickness, removing particles generated during the deposition of at least one or the layers, and filling the contact hole with an additional tungsten layer.

During the deposition of the initial tungsten layer, the tungsten layer may be deposited to a thickness of 100 Å or more.

Removing the particles may include etching the first tungsten layer to a (second) predetermined thickness using $SF_6$ in an etching chamber, removing the particles using $Cl_2$ gas, and out-gassing the etching chamber.

In this case, the tungsten layer may be etched to a thickness of about 10 Å. In addition, the out-gassing of the etching chamber may include out-gassing the etching chamber using Ar gas and/or out-gassing the etching chamber using $N_2$ gas.

The etching of the initial tungsten layer using $SF_6$ may be performed for about 7 seconds at a chamber pressure of about 10 mTorr, a source power of about 1200 W, a bias power of about 0 W, and a flow rate of about 70 sccm of $SF_6$ gas and $N_2$ gas.

The removal of the particles using $Cl_2$ gas may be performed for about 30 seconds at a chamber pressure of about 10 mTorr, a source power of about 1200 W, a bias power of about 0 W, and a flow rate of about 70 sccm of $Cl_2$ gas and Ar gas.

The out-gassing of the etching chamber using the Ar gas may be performed for about 15 seconds at a chamber pressure of about 10 mTorr, a source power of about 1200 W, a bias power of about 300 W, and a flow rate of about 70 sccm of Ar gas. The out-gassing of the etching chamber using the $N_2$ gas may be performed for about 15 seconds at a chamber pressure of about 10 mTorr, a source power of about 1200 W, a bias power of about 300 W, and a flow rate of about 70 sccm of $N_2$ gas.

In addition, the etching chamber may be pumped for about 15 seconds at a chamber pressure of about 0 Torr (e.g., less than 0.5, 0.2 or 0.1 mTorr, as the case may be), a source power of about 0 W, and a bias power of about 0 W.

BRIEF DESCRIPTION OF THE DRAWINGS

FIG. 4 is table showing process conditions for respective steps in FIG. 3.

DETAILED DESCRIPTION OF THE EMBODIMENTS

An exemplary embodiment of the present invention will hereinafter be described in detail with reference to the accompanying drawings.

Figure 1:
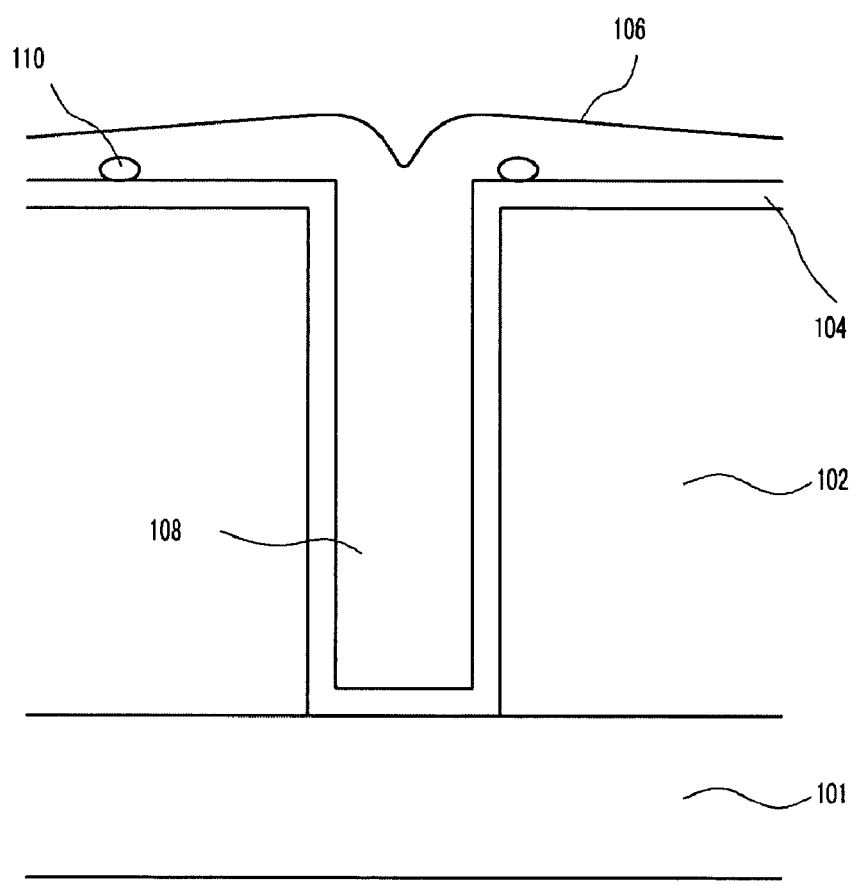
FIG. 1 is a schematic diagram of a semiconductor device for showing a conventional method of forming a contact in a semiconductor device.
Figure 2:
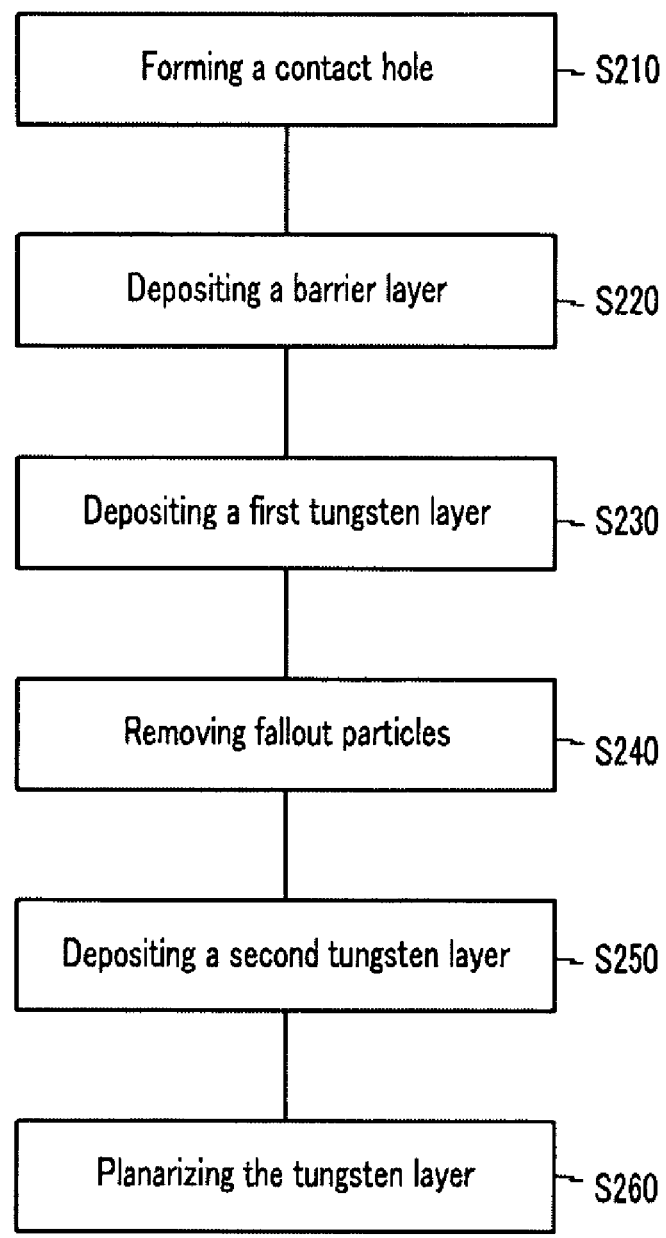
FIG. 2 is a process flowchart showing a method of forming a contact in a semiconductor device according to an exemplary embodiment of the present invention.
Figure 3:
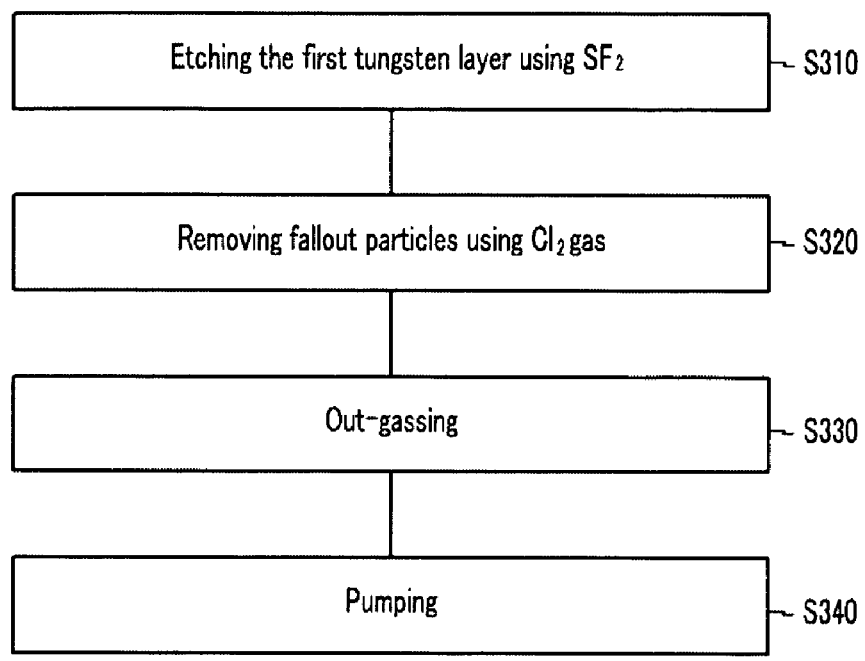
FIG. 3 is a process flowchart showing detailed steps of removing fallout particles in FIG. 2.
Figure 5A:
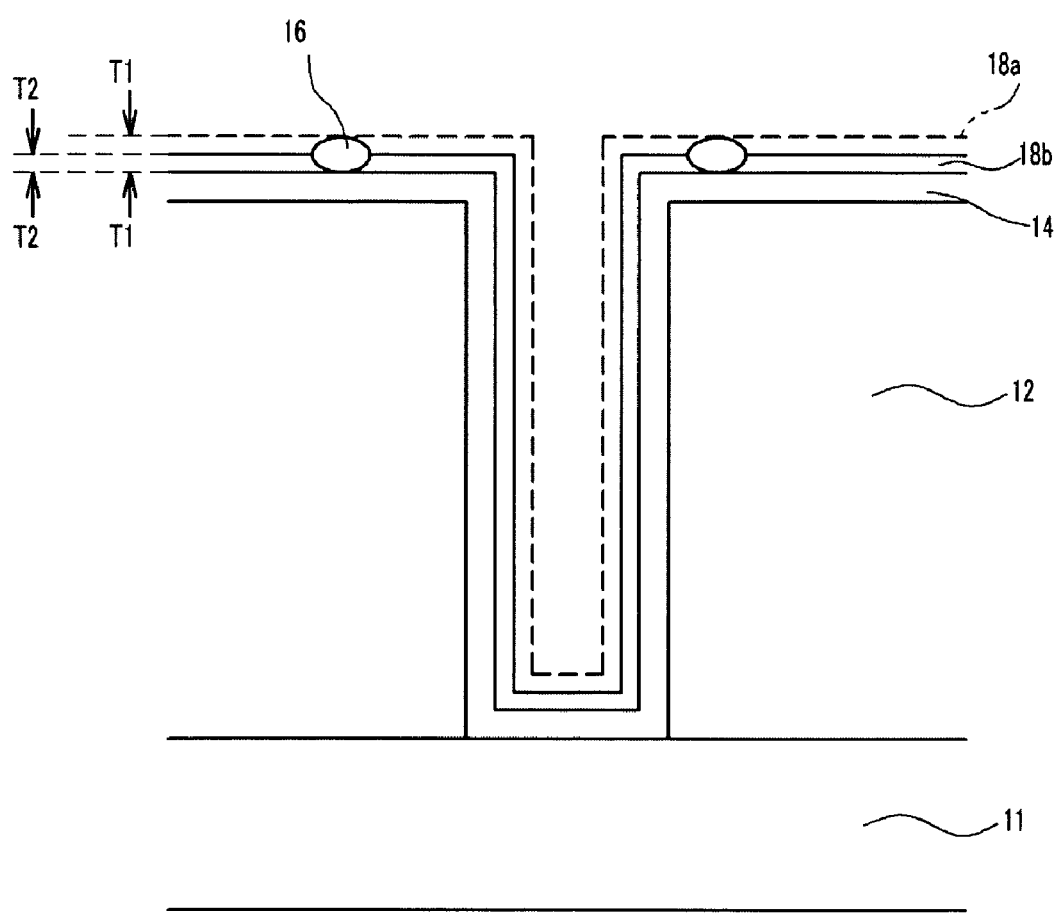
FIG. 5A and FIG. 5B are schematic (or cross-sectional) diagrams showing principal stages of a semiconductor device according to an exemplary embodiment of the present invention.
Figure 5B:
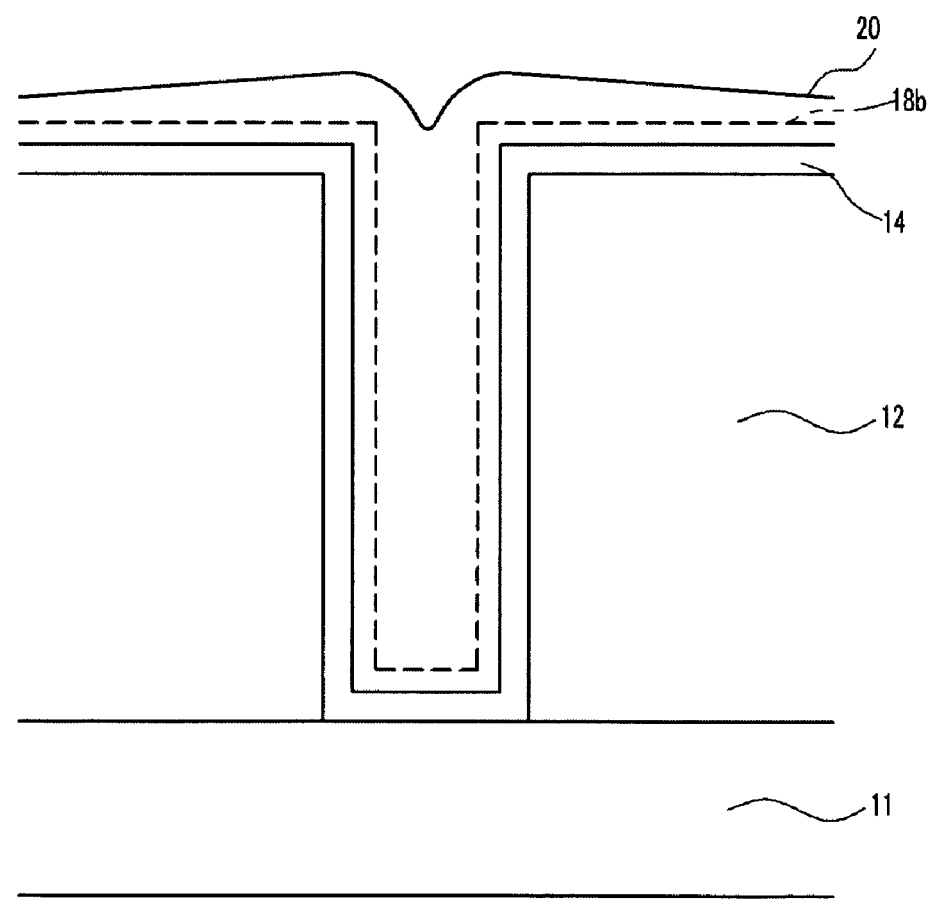

FIG. 2 is a process flowchart showing a method of forming a contact in a semiconductor device according to an exemplary embodiment of the present invention. FIG. 3 is a process flowchart showing detailed steps of removing fallout particles in FIG. 2. FIG. 4 is table showing process conditions for respective steps in FIG. 3. In addition, FIG. 5A and FIG. 5B are schematic diagrams showing principal stages of a semiconductor device according to an exemplary embodiment of the present invention.

According to a method of forming a contact in a semiconductor device according to an exemplary embodiment of the present invention, a tungsten layer is initially deposited on a barrier layer to a predetermined thickness, and then the tungsten layer is additionally deposited thereon after removing fallout particles.

In more detail, firstly at step S210, a contact hole is formed by selectively removing portions of an insulating layer 12 from a semiconductor substrate 11. In this case, the semiconductor substrate 11 may contain a lower metal line or a transistor structure beforehand, and the contact hole may be formed to expose or form a contact to the lower metal line or the transistor structure.

The insulating layer 12 may comprise tetraethyl orthosilicate (TEOS) or borophosphosilicate glass (BPSG), and such an insulating layer may be selectively etched using an etching mask.

After forming the contact hole, a barrier layer 14 is deposited on the insulating layer 12 and on the surface of the contact hole at step S220. The barrier layer 14 may be deposited by sputtering titanium (Ti) or a titanium (Ti)/titanium-nitride (TiN) bilayer, as is known in the art.

As has been described in the Background of the Invention, fallout particles 16 are usually generated during the deposition of the barrier layer 14, although it is also generally known in the art that particles may be generated or formed at practically every step in the manufacturing process. According to an exemplary embodiment of the present invention, the fallout particles 16 are removed by the following method.

At step S230, an initial tungsten layer 18a (refer to FIG. 5A) is initially deposited on the barrier layer 14, to at least a predetermined thickness T1 (for example, to a thickness of at least 100 Å).

Subsequently at step S240, the particles 16 are removed as follows.

FIG. 3 is a process flowchart showing details of the step S240 of removing fallout particles in FIG. 2. In order to remove the particles 16, firstly at step S310, the initial tungsten layer 18a is etched to remove a thickness such that it has a second predetermined or target thickness less than the initial tungsten layer thickness (e.g., of about 10 Å). In one implementation, plasma etching is performed for about 7 seconds at a plasma chamber pressure of about 10 mTorr, a source power of about 1200 W, a bias power of about 0 W, and at a flow rate of about 70 sccm of $SF_6$ gas and $N_2$ gas. The relative flow rates of $SF_6$ gas to $N_2$ gas may be anywhere from 1:1 to 1:50, or any ratio sufficient to accomplish or achieve the desired etched initial tungsten layer thickness. In FIG. 5A, the initial tungsten layer remaining after the etching is designated with reference numeral 18b. Thus, the present invention contemplates the step of etching the initial tungsten layer 18a, which may advantageously remove particles 16 from the wafer that may be formed thereon during formation or deposition of the barrier layer(s).

Subsequently, at step S320, the particles 16 are removed by maintaining the plasma chamber pressure at about 10 mTorr, the source power at about 1200 W, and the bias power at about 0 W, and by flowing $Cl_2$ gas and Ar gas at about 70 sccm. The relative flow rates of $Cl_2$ gas to $N_2$ gas may be anywhere from 1:1 to 1:50, or any ratio sufficient to accomplish or achieve the desired particle removal effect. Thus, the present invention also contemplates the step of plasma cleaning the initial tungsten layer 18a, which advantageously removes particles 16 from the wafer that may be formed thereon during formation or deposition of the barrier layer(s).

Then, at step S330, out-gassing of the chamber follows.

The out-gassing process may include a first out-gassing step using Ar gas and a second out-gassing step using $N_2$ gas. Alternatively, one of the out-gassing steps using Ar gas or $N_2$ gas may be sufficient, Ar gas or $N_2$ gas may be used for both out-gassing steps, or both Ar and $N_2$ gases may be used together in a single out-gassing step. In the first out-gassing step, the process is performed for about 15 seconds at a plasma chamber pressure of about 10 mTorr, a source power of about 1200 W, a bias power of about 300 W, and a flow rate of about 70 sccm of Ar gas. In the second out-gassing step, the process is performed for about 15 seconds at a plasma chamber pressure of about 10 mTorr, a source power of about 1200 W, a bias power of about 0 W, and a flow rate of about 70 sccm of $N_2$ gas.

After the out-gassing step, the gas in the plasma chamber is pumped out at step S340 for about 15 seconds at a chamber pressure of about 0 Torr (e.g., less than about 0.1 mTorr), a source power of about 0 W, and a bias power of about 0 W.

When the particle removing process S240 is finished, the contact hole is filled with an additional tungsten layer 20 at step S250 by depositing it on the remaining tungsten layer 18b, as shown in FIG. 5B. Thus the present invention contemplates depositing the additional tungsten layer 20 on the initial tungsten layer having (fallout) particles removed therefrom.

Finally at step S260, the contact may be finalized by planarizing the tungsten layer by CMP.

As described above, according to an exemplary embodiment of the present invention, particles generated during the deposition of a barrier layer can be effectively removed by initially depositing a tungsten layer and then removing the particles by an etching and/or plasma cleaning process before depositing additional tungsten to form a full contact. Therefore, a pattern failure due to fallout particles may be prevented, and thereby the yield may be improved.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of forming a semiconductor device, comprising the steps of:
   forming a contact hole by selectively removing portions of an insulating layer on a semiconductor substrate;

depositing a barrier layer on the insulating layer and in the contact hole;

conformally depositing an initial tungsten layer with a predetermined thickness on the barrier layer, such that a horizontal gap having a width less than that of the contact hole remains in the contact hole after depositing the initial tungsten layer;

removing a portion of the initial tungsten layer up to a second thickness excluding particles generated during at least one of the depositing steps; and filling the contact hole with an additional tungsten layer.

2. The method of claim 1, wherein the initial tungsten layer is deposited with a thickness of 100 Å.

3. The method of claim 1, wherein the second thickness is thinner than the first thickness.

4. The method of claim 1, wherein the portion of the initial tungsten layer is removed using a plasma formed from a gas comprising $SF_6$.

5. The method of claim 1, wherein removing the portion of the initial tungsten layer comprises:

etching the portion of the initial tungsten layer using $SF_6$ in an etching chamber;

removing the particles using $Cl_2$ gas;

first out-gassing the etching chamber using Ar gas; and second out-gassing the etching chamber using $N_2$ gas.

6. The method of claim 1, wherein the initial tungsten layer has a thickness of less than half of the horizontal gap remaining in the contact hole.

7. The method of claim 1, wherein the second thickness is about 10 Å.

8. A method of forming a semiconductor device, comprising the steps of:

selectively removing portions of an insulating layer on a semiconductor substrate to form a plurality of contact holes;

depositing a barrier layer on the insulating layer and in the contact holes;

conformally depositing an initial tungsten layer with a predetermined thickness on the barrier layer, wherein a horizontal gap having a width less than that of the contact hole remains in the contact hole;

etching a portion of the initial tungsten layer up to a second thickness less than the predetermined thickness such that a conformal tungsten layer remains in the contact hole; and filling the contact hole with an additional tungsten layer.

9. The method of claim 8, wherein the initial tungsten layer is deposited with a thickness of 100 Å.

10. The method of claim 8, wherein the second thickness is about 10 Å.

11. The method of claim 8, further comprising, after deposition of the initial tungsten layer, exposing the semiconductor device to a plasma comprising $Cl_2$ gas to remove particles.

12. The method of claim 8, wherein removing the portion of the initial tungsten layer exposes particles generated during at least one of the depositing steps.

13. The method of claim 8, wherein etching the portion of the initial tungsten layer comprises:

etching the portion of the initial tungsten layer in an etching chamber with a plasma comprising $SF_6$;

first out-gassing the etching chamber using Ar gas; and second out-gassing the etching chamber using $N_2$ gas.

14. The method of claim 8, wherein the initial tungsten layer has a thickness of less than half of the horizontal gap remaining in the contact hole.

15. A method of forming a semiconductor device, comprising the steps of:

selectively removing portions of an insulating layer on a semiconductor substrate to form a plurality of contact holes;

depositing a barrier layer on the insulating layer and in the contact holes;

conformally depositing an initial tungsten layer on the barrier layer, wherein the initial tungsten layer has a predetermined thickness and a horizontal gap having a width less than that of the contact hole remains in the contact hole;

plasma cleaning a portion of the initial tungsten layer in order to remove particles generated during the depositing from the semiconductor device; and filling the contact hole with an additional tungsten layer.

16. The method of claim 15, wherein the initial tungsten layer is deposited with a thickness of 100 Å.

17. The method of claim 15, wherein the plasma cleaned tungsten layer by the plasma cleaning step has a thickness of about 10 Å.

18. The method of claim 15, wherein plasma cleaning the portion of the initial tungsten layer comprises:

cleaning the initial tungsten layer in an etching chamber with a plasma comprising $SF_6$;

exposing the semiconductor device to a plasma comprising $Cl_2$ gas after the cleaning step;

first out-gassing the etching chamber using Ar gas; and second out-gassing the etching chamber using $N_2$ gas.

19. The method of claim 15, wherein the initial tungsten layer has a thickness of less than half of the horizontal gap remaining in the contact hole.

* * * * *